(12) United States Patent
Shin et al.

(10) Patent No.: US 9,691,832 B2
(45) Date of Patent: Jun. 27, 2017

(54) ORGANIC LIGHT EMITTING DISPLAY DEVICE AND METHOD OF MANUFACTURING ORGANIC LIGHT EMITTING DISPLAY DEVICE

(71) Applicant: SAMSUNG DISPLAY CO., LTD., Yongin-si, Gyeonggi-do (KR)

(72) Inventors: Min-Chul Shin, Seoul (KR); Sung-Ho Kim, Suwon-si (KR); Jong-Moo Huh, Hwaseong-si (KR); Bo-Kyung Choi, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/880,059

(22) Filed: Oct. 9, 2015

(65) Prior Publication Data
US 2016/0247865 A1    Aug. 25, 2016

(30) Foreign Application Priority Data
Feb. 23, 2015    (KR) .................. 10-2015-0025289

(51) Int. Cl.
*H01L 27/32* (2006.01)
*H01L 51/56* (2006.01)
*H01L 51/00* (2006.01)

(52) U.S. Cl.
CPC ...... *H01L 27/3258* (2013.01); *H01L 27/3272* (2013.01); *H01L 51/0014* (2013.01); *H01L 51/56* (2013.01); *H01L 27/3246* (2013.01); *H01L 2227/323* (2013.01)

(58) Field of Classification Search
None
See application file for complete search history.

(56) References Cited

U.S. PATENT DOCUMENTS

| 9,318,618 B2* | 4/2016 | Endo ................ H01L 29/7869 |
| 2008/0087889 A1* | 4/2008 | Chan ................ H01L 27/1229 257/40 |
| 2014/0367669 A1* | 12/2014 | Takeuchi ............ H01L 51/5088 257/40 |

FOREIGN PATENT DOCUMENTS

| KR | 10-2007-0002280 A | 1/2007 |
| KR | 10-2009-0041290 A | 4/2009 |
| KR | 10-2012-0019016 A | 3/2012 |
| KR | 10-2013-0127150 A | 11/2013 |

(Continued)

*Primary Examiner* — Joseph Schoenholtz
(74) *Attorney, Agent, or Firm* — Lewis Roca Rothgerber Christie LLP

(57) ABSTRACT

An organic light emitting display device, including a substrate, a first conductive layer pattern on the substrate, a first insulation layer pattern on the first conductive layer pattern, a first semiconductor layer pattern on the first insulation layer pattern, a gate insulation layer pattern on the gate insulation layer pattern, a gate electrode on the gate insulation layer pattern, a planarization layer on the gate electrode, the planarization layer including a first protruding portion protruded in a first direction perpendicular to an upper surface of the substrate, a lower electrode on the first protruding portion, a pixel defining layer exposing at least a portion of the lower electrode, the pixel defining layer covering opposite side portions of the first protruding portion, a light emitting layer on the lower electrode, and an upper electrode on the light emitting layer.

21 Claims, 17 Drawing Sheets

(56) References Cited

FOREIGN PATENT DOCUMENTS

KR  10-2013-0131809 A  12/2013
KR  10-2015-0033155 A  4/2015

* cited by examiner

ORGANIC LIGHT EMITTING DISPLAY DEVICE AND METHOD OF MANUFACTURING ORGANIC LIGHT EMITTING DISPLAY DEVICE

CROSS-REFERENCE TO RELATED APPLICATION

This application claims priority to and the benefit of Korean Patent Applications No. 10-2015-0025289, filed on Feb. 23, 2015 in the Korean Intellectual Property Office (KIPO), the content of which is incorporated herein in its entirety by reference.

BACKGROUND

1. Field

Aspects of example embodiments of the present invention relate generally to organic light emitting display devices and methods of manufacturing organic light emitting display devices.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting diode display device (hereinafter referred to as "OLED device"). Compared to the LCD device, the OLED device has many advantages such as a higher luminance and a wider viewing angle. In addition, the OLED device may be made thinner because the OLED device does not require a backlight. In the OLED device, electrons and holes are injected into an organic thin layer through a cathode and an anode, and then recombined in the organic thin layer to generate excitons, thereby a light of a certain wavelength may be emitted.

Recently, as the OLED device becomes larger and features high definition resolution, the number of mask processes used to manufacture the OLED device has increased. When the number of mask processes is increased, the cost of manufacturing the OLED device may also be significantly increased. For example, compared to the different processes, the cost of the mask process is relatively high. Accordingly, to reduce the cost of manufacturing the OLED device, a method capable of decreasing the number of mask processes is desired.

SUMMARY

Aspects of some example embodiments are directed to an organic light emitting display device including an external light blocking pattern under which a semiconductor element is located and an insulating interlayer having a relatively large thickness.

Aspects of some example embodiments are directed to a method of manufacturing an organic light emitting display device capable of reducing the number of a mask process.

According to some example embodiments, there is provided an organic light emitting display device, including: a substrate; a first conductive layer pattern on the substrate; a first insulation layer pattern on the first conductive layer pattern; a first semiconductor layer pattern on the first insulation layer pattern; a gate insulation layer pattern on the gate insulation layer pattern; a gate electrode on the gate insulation layer pattern; a planarization layer on the gate electrode, the planarization layer including a first protruding portion protruded in a first direction perpendicular to an upper surface of the substrate; a lower electrode on the first protruding portion; a pixel defining layer exposing at least a portion of the lower electrode, the pixel defining layer covering opposite side portions of the first protruding portion; a light emitting layer on the lower electrode; and an upper electrode on the light emitting layer.

In an embodiment, the first insulation layer pattern includes a second protruding portion, wherein the first semiconductor layer pattern includes a source region, a drain region, and a channel region between the source region and the drain region, wherein the first semiconductor layer pattern is on the second protruding portion, and wherein the gate insulation layer pattern is between the gate electrode and the channel region, and exposes the source and drain regions.

In an embodiment, a width of the first conductive layer pattern is the same as that of a lower surface of the first insulation layer pattern, and a width of an upper surface of the first insulation layer pattern is the same as that of the first semiconductor layer pattern.

In an embodiment, the width of the upper surface of the first insulation layer pattern is less than that of a lower surface of the first insulation layer pattern.

In an embodiment, the first semiconductor layer pattern exposes opposite side portions of the first insulation layer pattern.

In an embodiment, the gate insulation pattern covers the substrate and the first semiconductor layer pattern.

In an embodiment, the organic light emitting display device further includes: a second conductive layer pattern on the substrate, the second conductive layer being spaced from the first conductive pattern, the second conductive layer having a contact region; a second insulation layer pattern on the second conductive layer pattern, the second insulation layer pattern having a third protruding portion protruded in the first direction; and a second semiconductor layer pattern on the third protruding portion, the semiconductor layer pattern having a second contact region, wherein the first semiconductor layer pattern includes a source region, a drain region, and a channel region between the source region and the drain region.

In an embodiment, the organic light emitting display device further includes: an insulating interlayer between the substrate and the planarization layer, the insulating interlayer having first through fourth openings; a source electrode contacting the source region via the first opening; a drain electrode contacting the drain region via the second opening, the drain electrode defining a semiconductor element together with a gate electrode pattern, the first semiconductor layer pattern, and the source electrode; a first electrode contacting a first contact region via the third opening; and a second electrode contacting the second contact region via the fourth opening, the second electrode defining a capacitor together with the second conductive layer pattern, the second semiconductor layer pattern, and the first electrode.

In an embodiment, the fourth opening penetrates the insulating interlayer and the second insulation layer.

In an embodiment, a width of an upper surface of the second conductive layer pattern is the same as that of a lower surface of the second insulation layer, and a width of the second semiconductor layer pattern is the same as that of an upper surface of the second insulation layer, and wherein a width of an upper surface of the second insulation layer pattern is less than that of a lower surface of the second insulation layer pattern.

In an embodiment, the second semiconductor layer pattern exposes opposite side portions of the second insulation layer pattern.

According to some example embodiments, there is provided a method of manufacturing an organic light emitting display device, the method including: forming a semiconductor element on the substrate; forming a preliminary planarization layer that covers the semiconductor on the substrate; forming a lower electrode layer on the preliminary planarization layer; forming a preliminary pixel defining layer on the lower electrode layer by using a half tone mask; forming a pixel defining layer, a lower electrode, and a planarization layer having a third protruding portion by partially removing the preliminary pixel defining layer, the lower electrode layer, and the preliminary planarization layer; covering opposite side portions of a first protruding portion with the pixel defining layer by heating the pixel defining layer; forming a light emitting layer on the lower electrode; and forming an upper electrode on the light emitting layer.

In an embodiment, prior to forming the planarization layer, the method further includes: forming an insulating interlayer having first through fourth openings between the substrate and the planarization layer; and forming a source electrode, a drain electrode, a first electrode, and a second electrode in the first through fourth openings, respectively.

In an embodiment, forming the preliminary pixel defining layer on the lower electrode layer by using the half tone mask includes: forming a preliminary pixel defining layer having a first thickness on opposite side portions of the lower electrode layer and a second thickness on a center portion of the lower electrode layer, and wherein the second thickness is less than the first thickness, and the center portion is between the opposite side portions.

In an embodiment, forming the pixel defining layer, the lower electrode, and the planarization layer having the third protruding portion by partially removing the preliminary pixel defining layer, the lower electrode layer, and the preliminary planarization layer includes: exposing the lower electrode by removing the a portion of the preliminary pixel defining layer having the second thickness on a center portion of the lower electrode layer, and wherein, a portion of the preliminary planarization layer is removed while the preliminary pixel defining layer is removed, and a first protruding portion of the planarization layer is formed.

In an embodiment, the substrate includes a first region and a second region that is spaced apart from the first region, wherein forming the semiconductor element on the substrate includes: forming a conductive layer on the substrate; forming an insulation layer on the conductive layer; forming a semiconductor layer on the insulation layer; forming a first conductive layer pattern, a first insulation layer pattern having a second protruding portion, and a first semiconductor layer pattern in the first region and forming a second conductive layer pattern, a second insulation layer pattern having the third protruding portion, and a second semiconductor layer pattern in the second region by partially removing the conductive layer, the insulation layer, and the semiconductor layer; forming a gate insulation layer covering the conductive layer patterns, the insulation layer patterns, and the semiconductor patterns; forming a gate electrode layer on the gate insulation layer; and forming a gate electrode and a gate insulation layer pattern by partially removing the gate electrode layer and the gate insulation layer.

In an embodiment, after forming the semiconductor layer on the insulation layer, the method further includes: forming a first photoresist having a first thickness in the first region and forming a second photoresist having the first thickness and a second thickness in the second region by using a half tone mask, wherein the second thickness is less than the first thickness.

In an embodiment, the method further includes: exposing a first portion of the second semiconductor layer pattern by removing the second photoresist formed in the second thickness; and removing a portion of the second semiconductor layer pattern, wherein opposite side portions of the first semiconductor layer pattern are exposed while the second photoresist formed in the second thickness is removed, and a second portion opposite to the first portion of the second semiconductor layer pattern is exposed, and wherein opposite side portions of the exposed first semiconductor layer pattern and the second portion of the exposed second semiconductor layer pattern are removed while the first portion of the second semiconductor layer pattern is removed.

In an embodiment, after forming the gate electrode layer on the gate insulation layer, the method further includes: forming a photoresist on a portion of the gate electrode in the first region.

In an embodiment, forming the gate electrode layer on the gate insulation layer includes: partially removing the gate electrode layer; and partially removing the gate insulation layer, wherein opposite side portions of each of the first and second insulation layer patterns are removed while the gate insulation layer is removed, and each of the second and third protruding portions is formed.

BRIEF DESCRIPTION OF THE DRAWINGS

Example embodiments maybe understood in more detail from the following description taken in conjunction with the accompanying drawings, in which.

DETAILED DESCRIPTION

Hereinafter, embodiments of the present inventive concept will be explained in detail with reference to the accompanying drawings.

Figure 1:
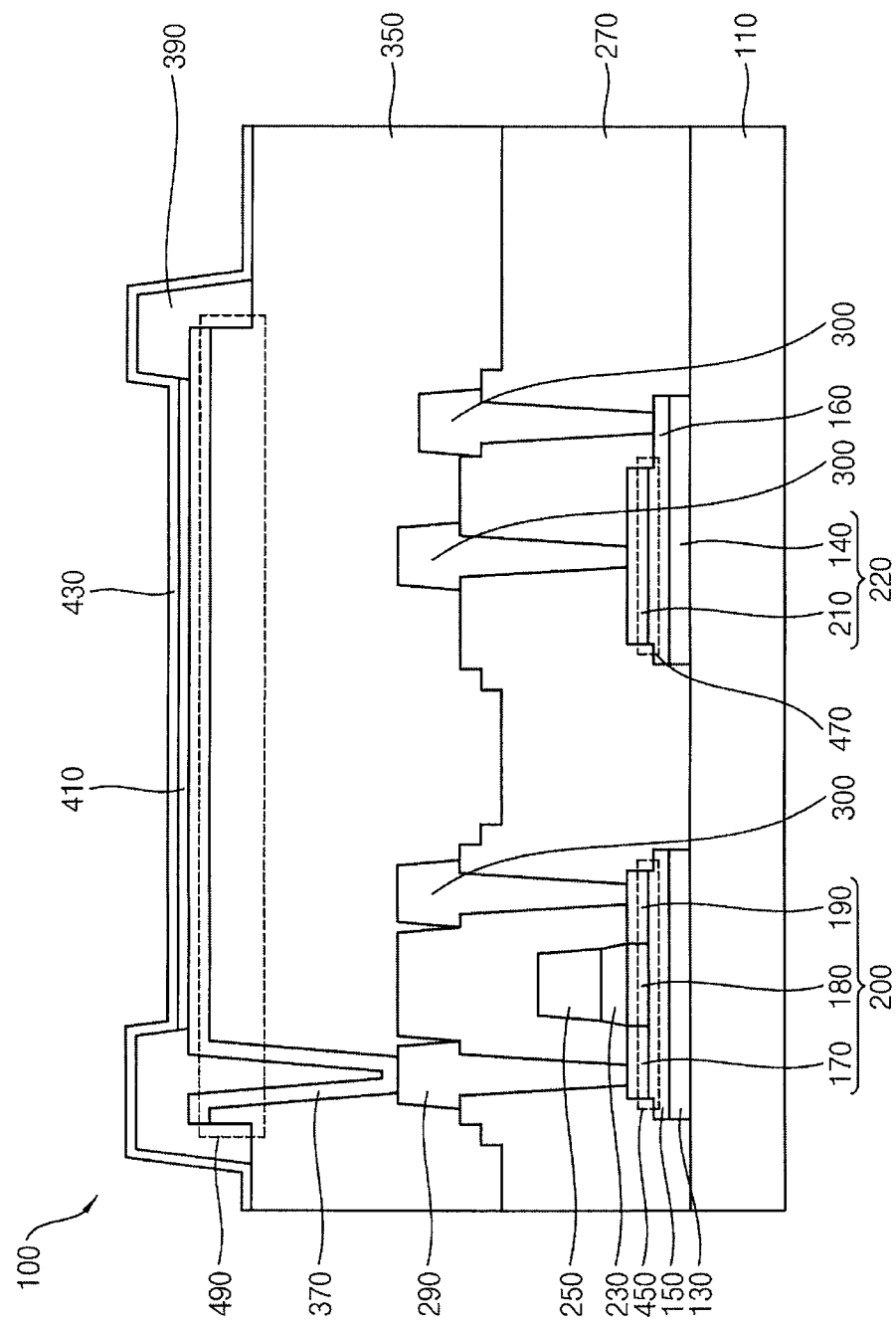
FIG. 1 is a cross-sectional view illustrating an organic light emitting display device in accordance with some example embodiments of the present invention.

FIG. 1 is a cross-sectional view illustrating an organic light emitting display device in accordance with some example embodiments of the present invention.

Referring to FIG. 1, an organic light emitting display (OLED) device 100 may include a substrate 110, a first conductive layer pattern 130, a second conductive layer pattern 140, a first insulation layer pattern 150, a second insulation layer pattern 160, a first semiconductor layer pattern 200, a second semiconductor layer pattern 210, a gate insulation layer pattern 230, a gate electrode 250, an insulating interlayer 270, a source electrode 290, a drain electrode 300, a first electrode 330, a second electrode 340, a planarization layer 350, a lower electrode 370, a pixel defining layer 390, a light emitting layer 410, an upper electrode 430, first through third protruding portion 490, 450, and 470, and the like. Here, the first semiconductor layer pattern 200 may have a source region 170, a channel region 180, and a drain region 190. In example embodiments, the planarization layer 350 may have the first protruding portion 490, and the first insulation layer pattern 150 may have the second protruding portion 450. In addition, the second insulation layer pattern 160 may have the third protruding portion 470. As the first conductive layer pattern 130 is disposed in a portion under which the channel region 180 is located, the OLED device 100 may serve as an OLED device capable of protecting the channel region 180.

The substrate 110 may have a first region and a second region. The first region may be spaced from the second region. The substrate 110 may be formed of transparent materials. For example, the substrate 110 may include quartz, synthetic quartz, calcium fluoride, fluoride-doping quartz, a sodalime glass, a non-alkali glass and/or the like. Alternatively, the substrate 110 may be formed of a flexible transparent resin substrate. Here, the flexible transparent resin substrate for the substrate 110 may include a polyimide substrate. For example, the polyimide substrate may include a first polyimide layer, a barrier film layer, a second polyimide layer, and/or the like. When the polyimide substrate is thin and flexible, the polyimide substrate may be formed on a rigid glass substrate to help support the formation of the light emitting structure (e.g., a semiconductor element, a capacitor, the lower electrode 370, the light emitting layer 410, the upper electrode 430, and/or the like). That is, in example embodiments, the substrate 110 may have a structure in which the first polyimide layer, the barrier film layer and the second polyimide layer are stacked on a glass substrate. Here, after an insulation layer is provided on the second polyimide layer, the light emitting structure may be disposed on the insulation layer. After the light emitting structure is formed on the insulation layer, the glass substrate may be removed. It may be difficult that the light emitting structure is directly formed on the polyimide substrate because the polyimide substrate is thin and flexible. Accordingly, the light emitting structure is formed on a rigid glass substrate, and then the polyimide substrate may serve as the substrate 110 after the removal of the glass substrate.

A buffer layer may be disposed on the substrate 110. For example, the buffer layer may be disposed on the entire substrate 110. The buffer layer may prevent the diffusion (e.g., an out gassing) of metal atoms and/or impurities from the substrate 110. Additionally, the buffer layer may control a rate of a heat transfer in a crystallization process for forming an active layer, thereby obtaining substantially uniform the active layer. Furthermore, the buffer layer may improve a surface flatness of the substrate 110 when a surface of the substrate 110 is relatively irregular. According to a type of the substrate 110, at least two buffer layers may be provided on the substrate 110, or the buffer layer may not be disposed (e.g., may be omitted).

Referring again to FIG. 1, the first conductive layer pattern 130 may be disposed in the first region on the substrate 110, and the second conductive layer pattern 140 may be disposed in the second region on the substrate 110. The first conductive layer pattern 130 may block an external light to protect the channel region 180. For example, the first conductive layer pattern 130 may serve as a light blocking pattern. The second conductive layer pattern 140 may serve as a lower electrode of a capacitor, may have a second contact region that is in contact with the second electrode 340. Each of the first conductive layer pattern 130 and the second conductive layer pattern 140 may be formed of a metal, an alloy, metal nitride, conductive metal oxide, and/or the like. For example, each of the first conductive layer pattern 130 and the second conductive layer pattern 140 may include aluminum (Al), an alloy containing aluminum, aluminum nitride (AlNx), silver (Ag), an alloy containing silver, tungsten (W), tungsten nitride (WNx), copper (Cu), an alloy containing copper, nickel (Ni), chrome (Cr), molybdenum (Mo), an alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), gallium oxide (GaOx), and/or the like. These may be used alone or in a suitable combination thereof. The first conductive layer pattern 130 and the second conductive layer pattern 140 may be concurrently (e.g., simultaneously) formed using the same or substantially the same materials.

The first insulation layer pattern 150 may be disposed in the first region on the first conductive layer pattern 130. In example embodiments, the first insulation layer pattern 150 may have the second protruding portion 450. The second protruding portion 450 may be protruded in a first direction that is perpendicular to (e.g., substantially perpendicular to) an upper surface of the substrate 110. For example, the width of a lower surface of the first insulation layer pattern 150 may be the same or substantially the same as the width of the first conductive layer pattern 130. In addition, the width of an upper surface of the first insulation layer pattern 150 may be the same or substantially the same as the width of lower surface of the first semiconductor layer pattern 200. That is, the width of the upper surface of the first insulation layer pattern 150 may be less than the width of the lower surface of the first insulation layer pattern 150.

The second insulation layer pattern 160 may be disposed in the second region on the second conductive layer pattern 140. In example embodiments, the second insulation layer pattern 160 may have the third protruding portion 470. The third protruding portion 470 may be protruded in the first direction. For example, the width of a lower surface of the second insulation layer pattern 160 may be the same or substantially the same as the width of the second conductive layer pattern 140. In addition, the width of an upper surface of the second insulation layer pattern 160 may be the same or substantially the same as the width of a lower surface of the second semiconductor layer pattern 210. That is, the width of the upper surface of the second insulation layer pattern 160 may be less than the width of lower surface of the second insulation layer pattern 160.

Each of the first insulation layer pattern 150 and the second insulation layer pattern 160 may be formed of a silicon compound, a metal oxide, and/or the like. For example, each of the first insulation layer pattern 150 and the second insulation layer pattern 160 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zinc oxide (ZnOx), titanium oxide (TiOx), and/or the like. That is, the first insulation layer pattern 150 and the second insulation layer pattern 160 may be concurrently (e.g., simultaneously) formed using the same or substantially the same materials.

The first semiconductor layer pattern 200 may be disposed in the first region on the second protruding portion 450 of the first insulation layer pattern 150. The first semiconductor layer pattern 200 may have a source region 170, a drain region 190, and a channel region 180 that is located between the source region 170 and the drain region 190. Here, in an etching process of the gate insulation layer pattern 230, the channel region 180 may not be doped by the gate electrode 250 and a photoresist that is disposed on the gate electrode 250, and the source region 170 and the drain region 190 may be doped with an impurity. As a result, the source region 170 and the drain region 190 may serve as conductors. Because the first semiconductor layer pattern 200 is disposed on the second protruding portion 450 of the first insulation layer pattern 150, the first semiconductor layer pattern 200 may expose opposite side portions of the first insulation layer pattern 150.

The second semiconductor layer pattern 210 may be disposed in the second region on the third protruding portion 470 of the second insulation layer pattern 160. The second semiconductor layer pattern 210 may have a first contact region that is in contact with the first electrode 330. In an etching process of the gate insulation layer pattern 230, the second semiconductor layer pattern 210 may be doped with an impurity. As a result, the second semiconductor layer pattern 210 may serve as a conductor. Because the second semiconductor layer pattern 210 is disposed on the third protruding portion 470 of the second insulation layer pattern 160, the second semiconductor layer pattern 210 may expose opposite side portions of the second insulation layer pattern 160.

Each of the first semiconductor layer pattern 200 and the second semiconductor layer pattern 210 may be formed of a semiconductor oxide including a binary compound (ABx), a ternary compound (ABxCy), a quaternary compound (ABxCyDz), and/or the like, which contain indium (In), zinc (Zn), gallium (Ga), tin (Sn), Ti, Al, hafnium (Hf), zirconium (Zr), magnesium (Mg), and/or the like. For example, each of the first semiconductor layer pattern 200 and the second semiconductor layer pattern 210 may include ZnOx, GaOx, TiOx, SnOx, indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), and/or the like. That is, the first semiconductor layer pattern 200 and the second semiconductor layer pattern 210 may be concurrently (e.g., simultaneously) formed using the same or substantially the same materials.

The gate insulation layer pattern 230 may be disposed in the first region on the first semiconductor layer pattern 200. In example embodiments, the gate insulation layer pattern 230 may be interposed between the gate electrode 250 and the channel region 180 of the first semiconductor layer pattern 200, and may expose the source region 170 and the drain region 190. The gate insulation layer pattern 230 may be formed of silicon compound, metal oxide, and/or the like. In an etching process of the gate insulation layer pattern 230, at least a portion of the opposite side portions of the first insulation layer pattern 150 that is exposed by the first semiconductor layer pattern 200 may be removed. As a result, the second protruding portion 450 of the first insulation layer pattern 150 may be formed. In a similar manner, in an etching process of the gate insulation layer pattern 230, at least a portion of the opposite side portions of the second insulation layer pattern 160 that is exposed by the second semiconductor layer pattern 210 may be removed. As a result, the third protruding portion 470 of the second insulation layer pattern 160 may be formed.

The gate electrode 250 may be disposed in the first region on the gate insulation layer pattern 230. The gate electrode 250 may be formed of a metal, an alloy, metal nitride, conductive metal oxide, and/or the like.

The insulating interlayer 270 may be disposed on the entire substrate 110. The insulating interlayer 270 may cover the first conductive layer pattern 130, the first insulation layer pattern 150, the first semiconductor layer pattern 200, the gate insulation layer pattern 230, the gate electrode 250, the second conductive layer pattern 140, the second insulation layer pattern 160, and the second semiconductor layer pattern 210, and may extend in a second direction (e.g., the second direction is perpendicular to the first direction) that is in parallel to the upper surface of the substrate 110. The insulating interlayer 270 may be disposed as a substantially uniform thickness on the substrate 110 along a profile of the first conductive layer pattern 130, the first insulation layer pattern 150, the first semiconductor layer pattern 200, the gate insulation layer pattern 230, the gate electrode 250, the second conductive layer pattern 140, the second insulation layer pattern 160, and the second semiconductor layer pattern 210.

Alternatively, the insulating interlayer 270 may sufficiently cover the first conductive layer pattern 130, the first insulation layer pattern 150, the first semiconductor layer pattern 200, the gate insulation layer pattern 230, the gate electrode 250, the second conductive layer pattern 140, the second insulation layer pattern 160, and the second semiconductor layer pattern 210. The insulating interlayer 270 may have a substantially level surface without a step around the first conductive layer pattern 130, the first insulation layer pattern 150, the first semiconductor layer pattern 200, the gate insulation layer pattern 230, the gate electrode 250, the second conductive layer pattern 140, the second insulation layer pattern 160, and the second semiconductor layer pattern 210. The insulating interlayer 270 may have first through fourth openings. In example embodiments, the insulating interlayer 270 may be relatively thickly formed. For example, after an additional electrode is disposed on the gate electrode 250, the gate electrode 250 and the additional electrode may be used as a capacitor. In this case, the insulating interlayer 270 may be interposed between the gate electrode 250 and the additional electrode, and may be relatively thinly formed. Additionally, in example embodiments, as the second conductive layer pattern 140 is disposed, the second conductive layer pattern 140 and the second semiconductor layer pattern 210 may serve as a capacitor. Thus, as the insulating interlayer 270 is thickly disposed without the additional electrode, the channel region 180 of a semiconductor element may be protected. The insulating interlayer 270 may be formed of a silicon compound, a metal oxide, and/or the like.

The source electrode 290 and the drain electrode 300 may be disposed in the first region on the first semiconductor layer pattern 200. The source electrode 290 may be in contact with the source region 170 via the first opening of the insulating interlayer 270, and the drain electrode 300 may be in contact with the drain region 190 via the second opening of the insulating interlayer 270. Thus, a semiconductor element having the first semiconductor layer pattern 200, the gate electrode 250, the source electrode 290, and the drain electrode 300 may be defined. Alternatively, a position of the source electrode 290 on the source region 170 and a position of the drain electrode 300 on the drain region 190 may be swapped according to a type of the semiconductor element.

The first electrode 330 may be disposed in the second region on the second semiconductor layer pattern 210, and the second electrode 340 may be disposed in the second region on the second conductive layer pattern 140. The first electrode 330 may be in contact with the first contact region of the second semiconductor layer pattern 210 via the third opening of the insulating interlayer 270, and the second electrode 340 may be in contact with the second contact region of the second conductive layer pattern 140 via the fourth opening of the insulating interlayer 270. Here, the fourth opening may penetrate a portion of the second insulation layer pattern 160. Thus, a capacitor 220 having the second conductive layer pattern 140, the second semiconductor layer pattern 210, the first electrode 330, and the second electrode 340 may be defined.

Each of the source electrode 290, the drain electrode 300, the first electrode 330, and the second electrode 340 may be formed of a metal, an alloy, metal nitride, conductive metal oxide, transparent conductive materials, and/or the like. That is, each of the source electrode 290, the drain electrode 300, the first electrode 330, and the second electrode 340 may be concurrently (e.g., simultaneously) formed using the same or substantially the same materials.

The planarization layer 350 may be disposed on the entire substrate 110. The planarization layer 350 may cover the insulating interlayer 270, the source electrode 290, the drain electrode 300, the first electrode 330, and the second electrode 340, and may extend in the second direction. The planarization layer 350 may sufficiently cover the insulating interlayer 270, the source electrode 290, the drain electrode 300, the first electrode 330, and the second electrode 340, and may have a substantially level surface without a step around an upper surface of the planarization layer 350 except a first protruding portion 490. In example embodiments, the planarization layer 350 may have the first protruding portion 490. The first protruding portion 490 may be protruded in the first direction. In addition, the planarization layer 350 may have a fifth opening. The fifth opening may be located in a portion under which the source electrode 290 is located. The planarization layer 350 may be formed of silicon compound, metal oxide, and/or the like.

The lower electrode 370 may be disposed on the first protruding portion 490 of the planarization layer 350. The lower electrode 370 may be in contact with the source electrode 290 via the fifth opening. Here, the lower electrode 370 may be disposed along an inner surface of the fifth opening. That is, the lower electrode 370 may be disposed in a portion of the fifth opening, and thus the lower electrode 370 may be electrically connected to the semiconductor element. Because the lower electrode 370 is disposed on the first protruding portion 490, the lower electrode 370 may expose opposite side portions of the planarization layer 350. The lower electrode 370 may be formed of a metal, an alloy, a metal nitride, a conductive metal oxide, transparent conductive materials, and/or the like.

The pixel defining layer 390 may be disposed on a portion of the lower electrode 370 and a portion of the planarization layer 350. In example embodiments, the pixel defining layer 390 may expose at least a portion the lower electrode 370, may cover the opposite side portions of the first protruding portion 490. In addition, the pixel defining layer 390 may fill the fifth opening. The pixel defining layer 390 may be formed of organic materials or inorganic materials. For example, the pixel defining layer 390 may include silicon oxide, silicon nitride, silicon oxynitride, silicon oxycarbide, polyimide-based resin, photoresist, acryl-based resin, polyamide-based resin, siloxane-based resin, and/or the like.

The light emitting layer 410 may be disposed on at least a portion the lower electrode 370 that is exposed by the pixel defining layer 390. The light emitting layer 410 may be formed using at least one selected from light emitting materials capable of generating different colors of light (e.g., a red color of light, a green color of light, a blue color of light). Alternatively, the light emitting layer 410 may emit a white color of light by stacking light emitting materials capable of generating different colors of light such as the red color of light, the green color of light, the blue color of light.

The upper electrode 430 may be disposed on the pixel defining layer 390 and the light emitting layer 410. The upper electrode 430 may cover the pixel defining layer 390 and the light emitting layer 410, and may extend in the second direction. That is, the upper electrode 430 may be disposed on the entire substrate 110. The upper electrode 430 may be formed of a metal, an alloy, metal nitride, conductive metal oxide, transparent conductive materials, and/or the like.

In some example embodiments, an encapsulation substrate may be disposed on the upper electrode 430. The encapsulation substrate and the substrate 110 may include substantially the same materials. For example, the encapsulation substrate may be formed of quartz, synthetic quartz, calcium fluoride, fluoride-doping quartz, sodalime glass, non-alkali glass and/or the like. Alternatively, the encapsulation substrate may be formed of a transparent inorganic material or flexible plastic. For example, the encapsulation substrate may include a flexible transparent resin substrate. In this case, to increase flexibility of the OLED device 100, the encapsulation substrate may include a stacked structure where at least one organic layer and at least one inorganic layer are alternately stacked.

The OLED device 100 in accordance with example embodiments includes the first conductive layer pattern 130 capable of blocking an external light and the insulating interlayer 270 that has a relatively large thickness, and may protect the channel region 180 of the semiconductor element. Accordingly, the reliability and stability of the semiconductor element included in the OLED device 100 may be increased. In addition, as the number of mask processes that is used to manufacture the OLED device 100 is reduced to, for example, six, a manufacturing cost of the OLED device 100 may be reduced.

FIGS. 2 through 16 are cross-sectional views illustrating a method of manufacturing an organic light emitting display device in accordance with example embodiments of the present invention.

Figure 2:
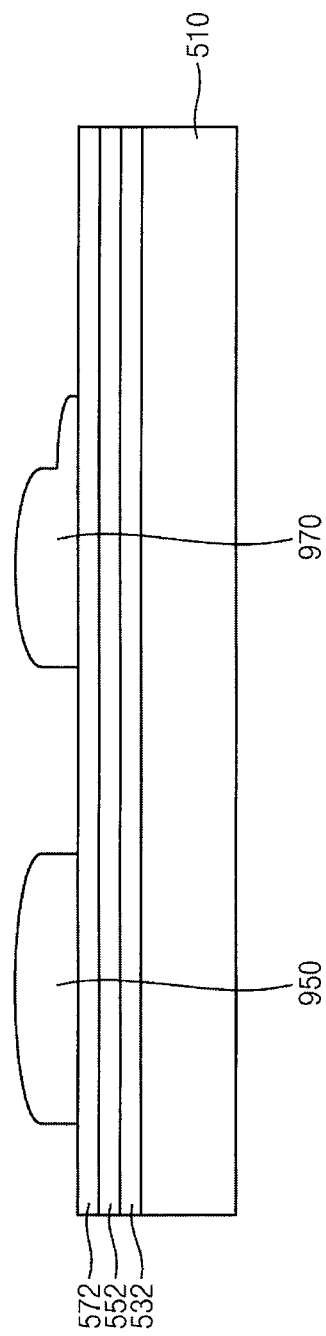
FIGS. 2 through 16 are cross-sectional views illustrating a method of manufacturing an organic light emitting display device in accordance with some example embodiments of the present invention.

Referring to FIG. 2, a substrate 510 having a first region and a second region may be provided. The first region may be spaced from the second region. The substrate 510 may be formed using quartz, synthetic quartz, calcium fluoride, fluoride-doping quartz, a sodalime glass, a non-alkali glass and/or the like.

A conductive layer 532 may be formed on the substrate 510. The conductive layer 532 may extend a second direction that is in parallel to an upper surface of the substrate 510. That is, the conductive layer 532 may be formed on the entire substrate 510. The conductive layer 532 may be formed using a metal, an alloy, metal nitride, conductive metal oxide, and/or the like. For example, the conductive layer 532 may include Al, an alloy containing aluminum, AlNx, Ag, an alloy containing silver, W, WNx, Cu, an alloy containing copper, Ni, Cr, Mo, an alloy containing molybdenum, Ti, TiNx, Pt, Ta, TaNx, Nd, Sc, SrRuxOy, ZnOx, ITO, SnOx, GaOx, and/or the like. These may be used alone or in a suitable combination thereof.

An insulation layer 552 may be formed on the conductive layer 532. The insulation layer 552 may extend in the second direction on the conductive layer 532. That is, the insulation layer 552 may be formed on the entire conductive layer 532. The insulation layer 552 may include a silicon compound, a metal oxide, and/or the like. For example, the insulation layer 552 may be formed using SiOx, SiNx, SiOxNy, SiOxCy, SiCxNy, AlOx, AlNx, TaOx, HfOx, ZnOx, TiOx, and/or the like.

A semiconductor layer 572 may be formed on the insulation layer 552. The semiconductor layer 572 may extend in the second direction on the 552. That is, the semiconductor layer 572 may be formed on the entire insulation layer 552. The semiconductor layer 572 may be formed of a semiconductor oxide including a binary compound (ABx), a ternary compound (ABxCy), a quaternary compound (ABxCyDz), and/or the like, which contain In, Zn, Ga, Sn, Ti, Al, Hf, Zr, Mg, and/or the like. For example, the semiconductor layer 572 may be formed using ZnOx, GaOx, TiOx, SnOx, InOx, IGO, IZO, ITO, GZO, ZMO, ZTO, ZnZrxOy, IGZO, IZTO, IGHO, TAZO, IGTO, and/or the like.

In example embodiments, a first photoresist 950 having a first thickness may be formed in a first region. In addition, a second photoresist 970 having the first thickness and a second thickness, which is less than the first thickness, is formed in the second region by using a half tone mask. In example embodiments, in this step, a first mask process may be performed.

Figure 3:
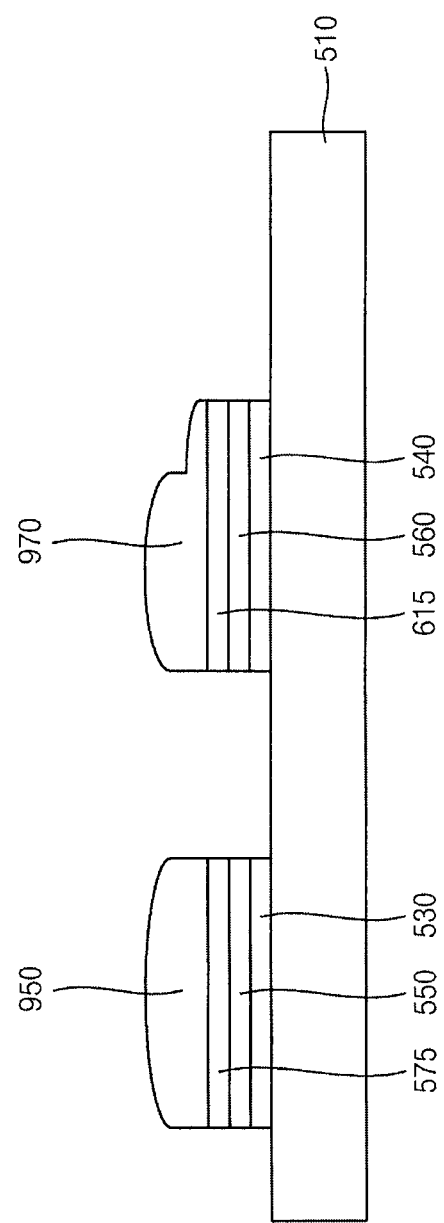

Referring to FIG. 3, the conductive layer 532, the insulation layer 552, and the semiconductor layer 572 may be partially removed by using a method by which the first photoresist 950 and the second photoresist 970 are used as masks. In this case, a first conductive layer pattern 530, a first insulation layer pattern 550, and a preliminary first semiconductor pattern 575 may be formed in the first region, and a second conductive layer pattern 540, a second insulation layer pattern 560, and a preliminary second semiconductor pattern 615 may be formed in the second region.

Figure 4:
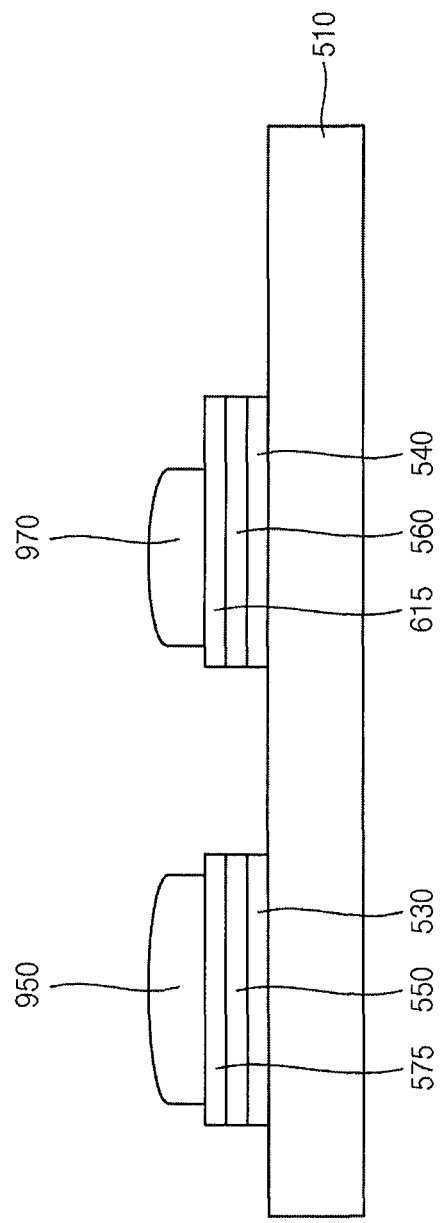

Referring to FIG. 4, a first portion of the preliminary second semiconductor pattern 615 may be exposed by removing a portion of the second photoresist 970 that is formed with the second thickness. Here, the first portion may be a portion that the second photoresist 970 formed with the second thickness is located. While the second photoresist 970 formed with the second thickness is removed, opposite side portions of the preliminary first semiconductor pattern 575 may be exposed, and a second portion of the preliminary second semiconductor pattern 615 may be exposed. Here, the second portion may be opposite to the first portion.

Figure 5:
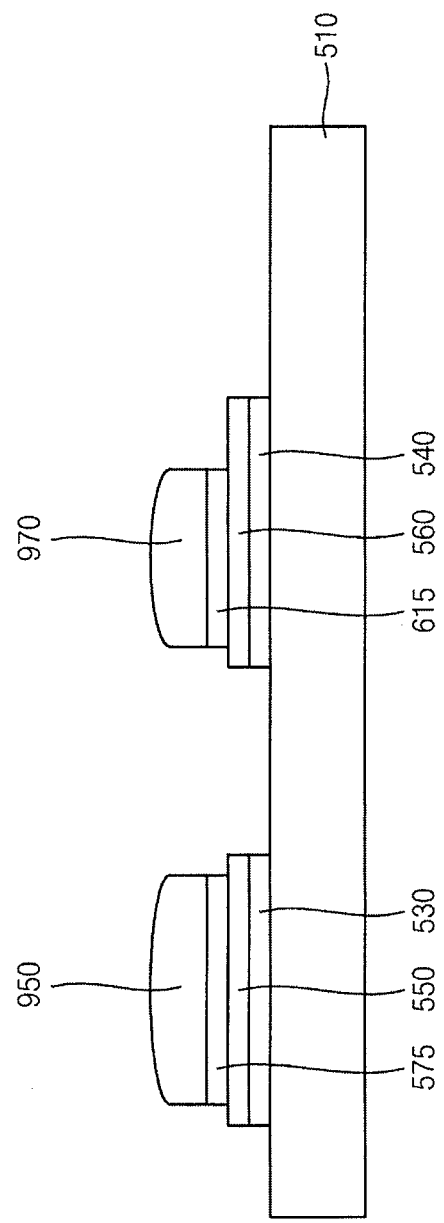

Referring to FIG. 5, the first portion of the preliminary second semiconductor pattern 615 may be removed. While the first portion of the preliminary second semiconductor pattern 615 is removed, the exposed opposite side portions of the preliminary first semiconductor pattern 575 and the exposed second portion of the preliminary second semiconductor pattern 615 may be removed. That is, the preliminary first semiconductor pattern 575 may expose opposite side portions of the first insulation layer pattern 550, and the preliminary second semiconductor pattern 615 may expose opposite side portions of the second insulation layer pattern 560.

Figure 6:
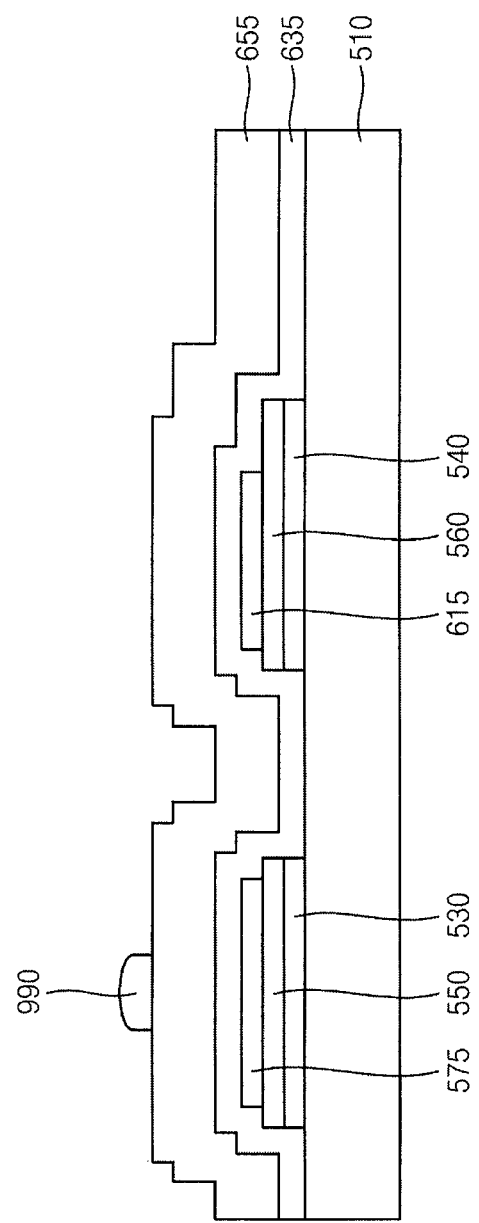

Referring to FIG. 6, after the first photoresist 950 and the second photoresist 970 are removed, a gate insulation layer 635 may be formed on the substrate 510, the first conductive layer pattern 530, the first insulation layer pattern 550, the preliminary first semiconductor pattern 575, the second conductive layer pattern 540, the second insulation layer pattern 560, and the preliminary second semiconductor pattern 615. The gate insulation layer 635 may cover the first conductive layer pattern 530, the first insulation layer pattern 550, the preliminary first semiconductor pattern 575, the second conductive layer pattern 540, the second insulation layer pattern 560, and the preliminary second semiconductor pattern 615 on the substrate 510, and may extend in the second direction. That is, the gate insulation layer 635 may be formed on the entire substrate 510 along a profile of the first conductive layer pattern 530, the first insulation layer pattern 550, the preliminary first semiconductor pattern 575, the second conductive layer pattern 540, the second insulation layer pattern 560, and the preliminary second semiconductor pattern 615. The gate insulation layer 635 may be formed using a silicon compound, metal oxide, and/or the like.

After the gate insulation layer 635 is formed, a gate electrode layer 655 may be formed on the gate insulation layer 635. The gate electrode layer 655 may cover the gate insulation layer 635, and may extend in second direction. That is, the gate electrode layer 655 may be formed on the entire substrate 510 along a profile of the gate insulation layer 635. The gate insulation layer 635 may be formed using a metal, an alloy, metal oxide, conductive metal oxide, and/or the like.

After the gate electrode layer 655 is formed, a third photoresist 990 may be formed in the first region on the gate electrode layer 655. In example embodiments, in this step, a second mask process may be performed.

Figure 7:
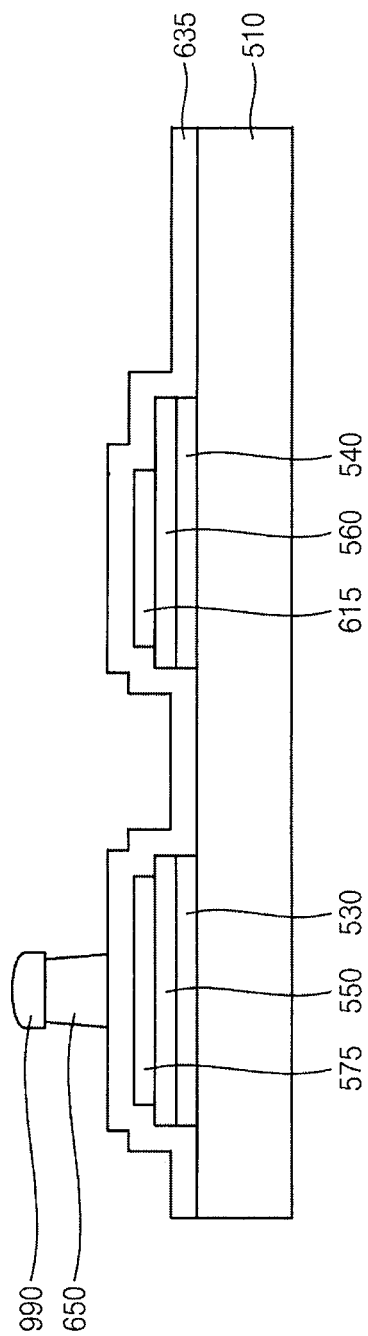

Referring to FIG. 7, the gate electrode layer 655 may be partially removed by using a method by which the third photoresist 990 is used as a mask. In this case, a gate electrode 650 may be formed in the first region.

Figure 8:
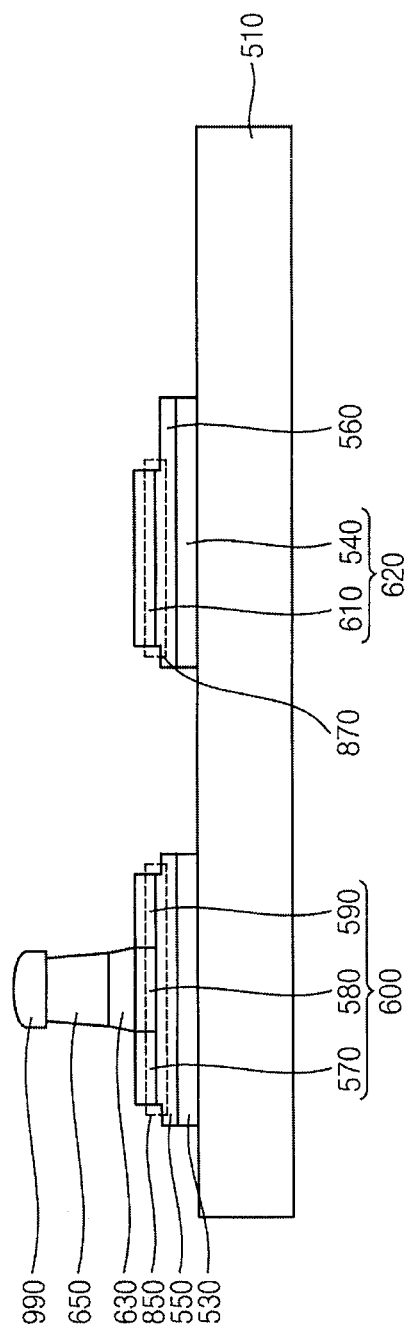

Referring to FIG. 8, the gate insulation layer 635 may be partially removed by using a method by which the third photoresist 990 and the gate electrode 650 are used as masks. In this case, a gate insulation layer patter 630 may be formed in the first region. In a removing process of the gate insulation layer 635, a channel region 580 of the preliminary first semiconductor pattern 575 may not be doped by the gate electrode 650 and the third photoresist 990, and source and drain regions 570 and 590 of the preliminary first semiconductor pattern 575 may be doped with an impurity. As a result, the source region 570 and the drain region 590 may serve as a conductor, and a first semiconductor layer pattern 600 having the source region 570, the channel region 580, and the drain region 590 may be formed. In addition, in a removing process of the gate insulation layer 635, the preliminary second semiconductor pattern 615 may be doped with an impurity. As a result, the preliminary second semiconductor pattern 615 may serve as a conductor, and a second semiconductor layer pattern 610 may be formed.

In example embodiments, while the gate insulation layer 635 is removed, the exposed opposite side portions of the first insulation layer pattern 550 may be removed. Because the exposed opposite side portions of the first insulation layer pattern 550 are removed, a second protruding portion 850 may be formed. Here, the second protruding portion 850 may be protruded in a first direction that is perpendicular to (e.g., substantially perpendicular to) an upper surface of the substrate 510. In addition, while the gate insulation layer 635 is removed, the opposite side portions of the second insulation layer pattern 560 may be removed. Because the opposite side portions of the second insulation layer pattern 560 are removed, a third protruding portion 870 may be formed. Here, the third protruding portion 870 may be protruded in the first direction.

Figure 9:
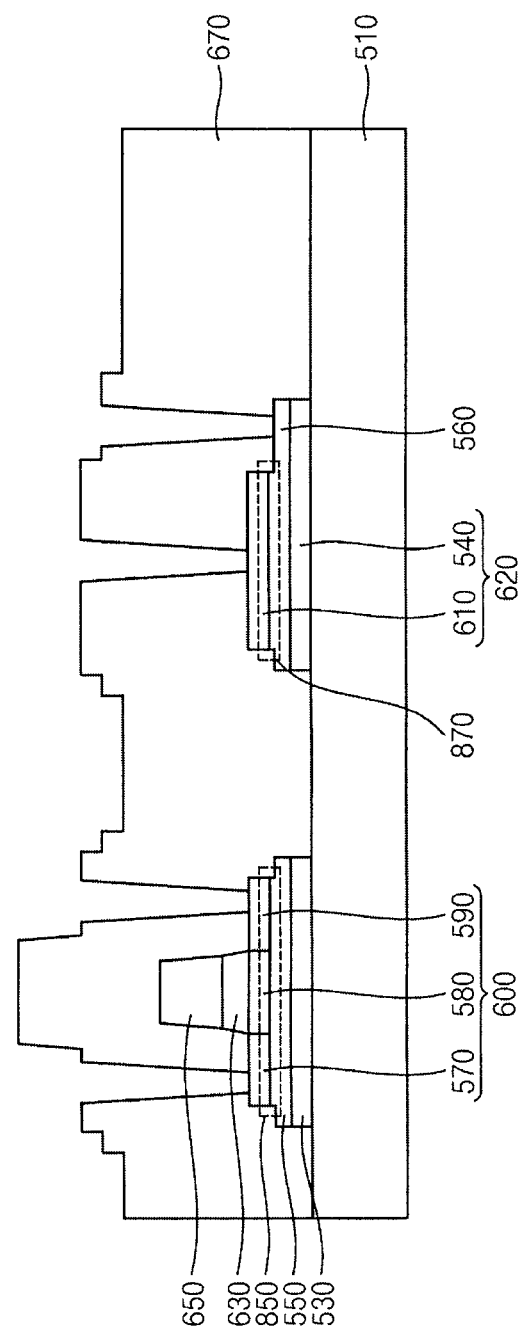

Referring to FIG. 9, an insulating interlayer 670 may be formed on the substrate 510, the first conductive layer pattern 530, the first insulation layer pattern 550, the first semiconductor layer pattern 600, the gate insulation layer patter 630, the gate electrode 650, the second conductive layer pattern 540, the second insulation layer pattern 560, and the second semiconductor layer pattern 610. The insulating interlayer 670 may cover the first conductive layer pattern 530, the first insulation layer pattern 550, the first semiconductor layer pattern 600, the gate insulation layer patter 630, the gate electrode 650, the second conductive layer pattern 540, the second insulation layer pattern 560, and the second semiconductor layer pattern 610 on the substrate 510, and may extend in the second direction. That is, the insulating interlayer 670 may be formed on the entire substrate 510 along a profile of the first conductive layer pattern 530, the first insulation layer pattern 550, the first semiconductor layer pattern 600, the gate insulation layer patter 630, the gate electrode 650, the second conductive layer pattern 540, the second insulation layer pattern 560, and the second semiconductor layer pattern 610. The insulating interlayer 670 may have first through fourth openings. The insulating interlayer 670 may be formed using a silicon compound, metal oxide, and/or the like. In example embodiments, in this step, a third mask process may be performed.

Figure 10:
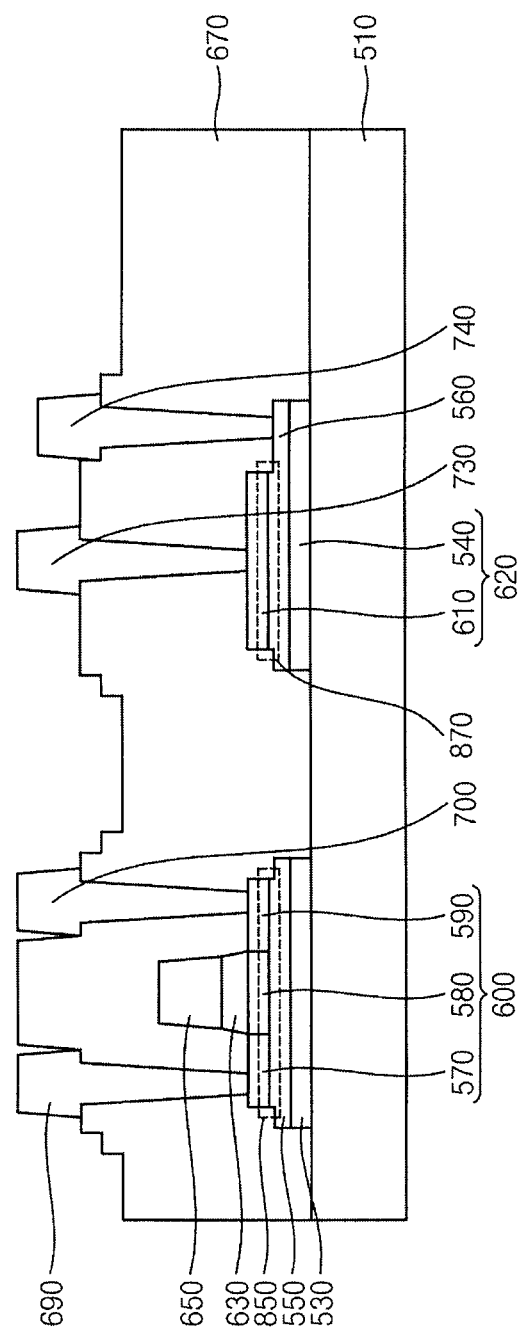

Referring to FIG. 10, a source electrode 690 and a drain electrode 700 may be formed in the first region on the first semiconductor layer pattern 600. The source electrode 690 may be in contact with the source region 570 via the first opening of the insulating interlayer 670, and the drain electrode 700 may be in contact with the drain region 590 via the second opening of the insulating interlayer 670. Thus, a semiconductor element having the first semiconductor layer pattern 600, the gate electrode 650, the source electrode 690, and the drain electrode 700 may be formed.

A first electrode 730 may be formed in the second region on the second semiconductor layer pattern 610, and a second electrode 740 may be formed in the second region on the second conductive layer pattern 540. The first electrode 730 may be in contact with a first contact region of the second semiconductor layer pattern 610 via the third opening of the insulating interlayer 670, and the second electrode 740 may be in contact with a second contact region of the second conductive layer pattern 540 via the fourth opening of the insulating interlayer 670. Here, the fourth opening may penetrate a portion of the second insulation layer pattern 560. Thus, a capacitor 620 having the second conductive layer pattern 540, the second semiconductor layer pattern 610, the first electrode 730, and the second electrode 740 may be formed. Each of the source electrode 690, the drain electrode 700, the first electrode 730, and the second electrode 740 may be formed using a metal, an alloy, metal nitride, conductive metal oxide, transparent conductive materials, and/or the like. In example embodiments, in this step, a fourth mask process may be performed.

Figure 11:
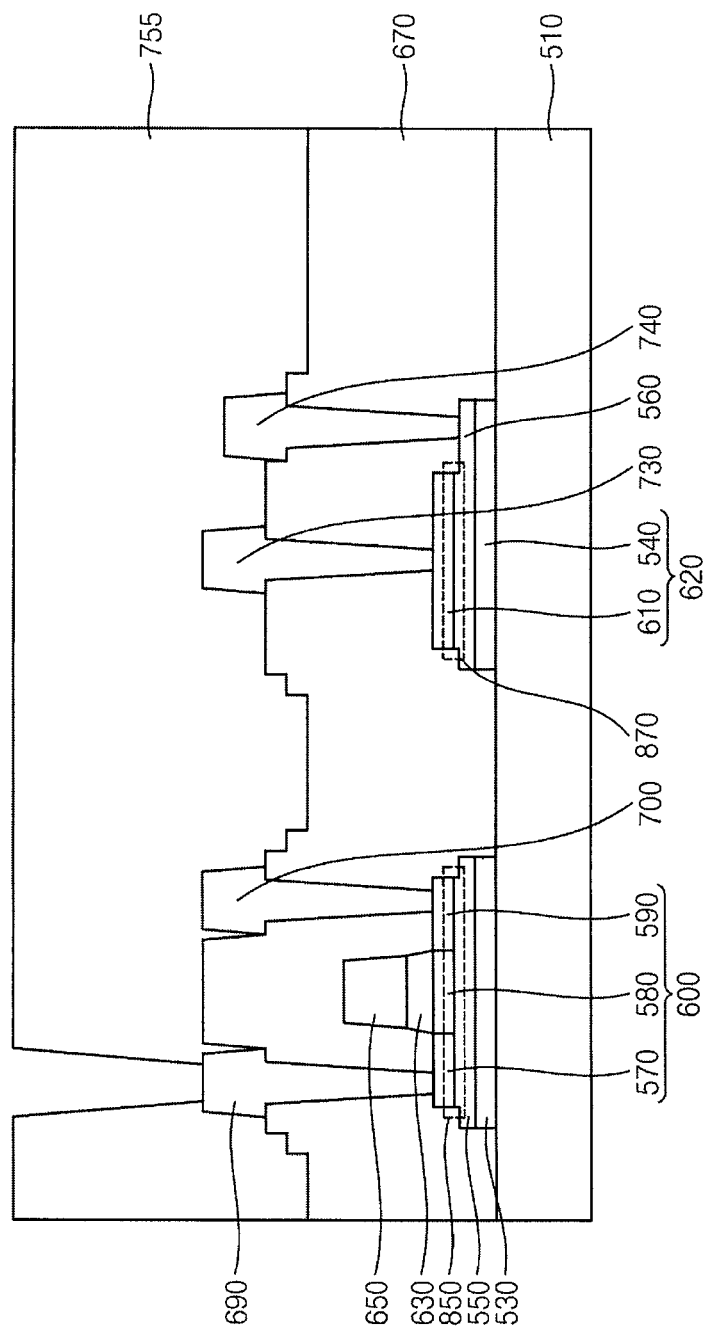

Referring to FIG. 11, a preliminary planarization layer 755 may be formed on the entire substrate 510. The preliminary planarization layer 755 may cover the insulating interlayer 670, the source electrode 690, the drain electrode 700, the first electrode 730, and the second electrode 740, and may extend in the second direction. The preliminary planarization layer 755 may sufficiently cover the insulating interlayer 670, the source electrode 690, the drain electrode 700, the first electrode 730, and the second electrode 740, and may have a substantially level surface without a step around an upper surface of the preliminary planarization layer 755. The preliminary planarization layer 755 may have a fifth opening. The fifth opening may be located in a portion under which the source electrode 690 is located. The preliminary planarization layer 755 may be formed using a silicon compound, metal oxide, and/or the like. In example embodiments, in this step, a fifth mask process may be performed.

Figure 12:
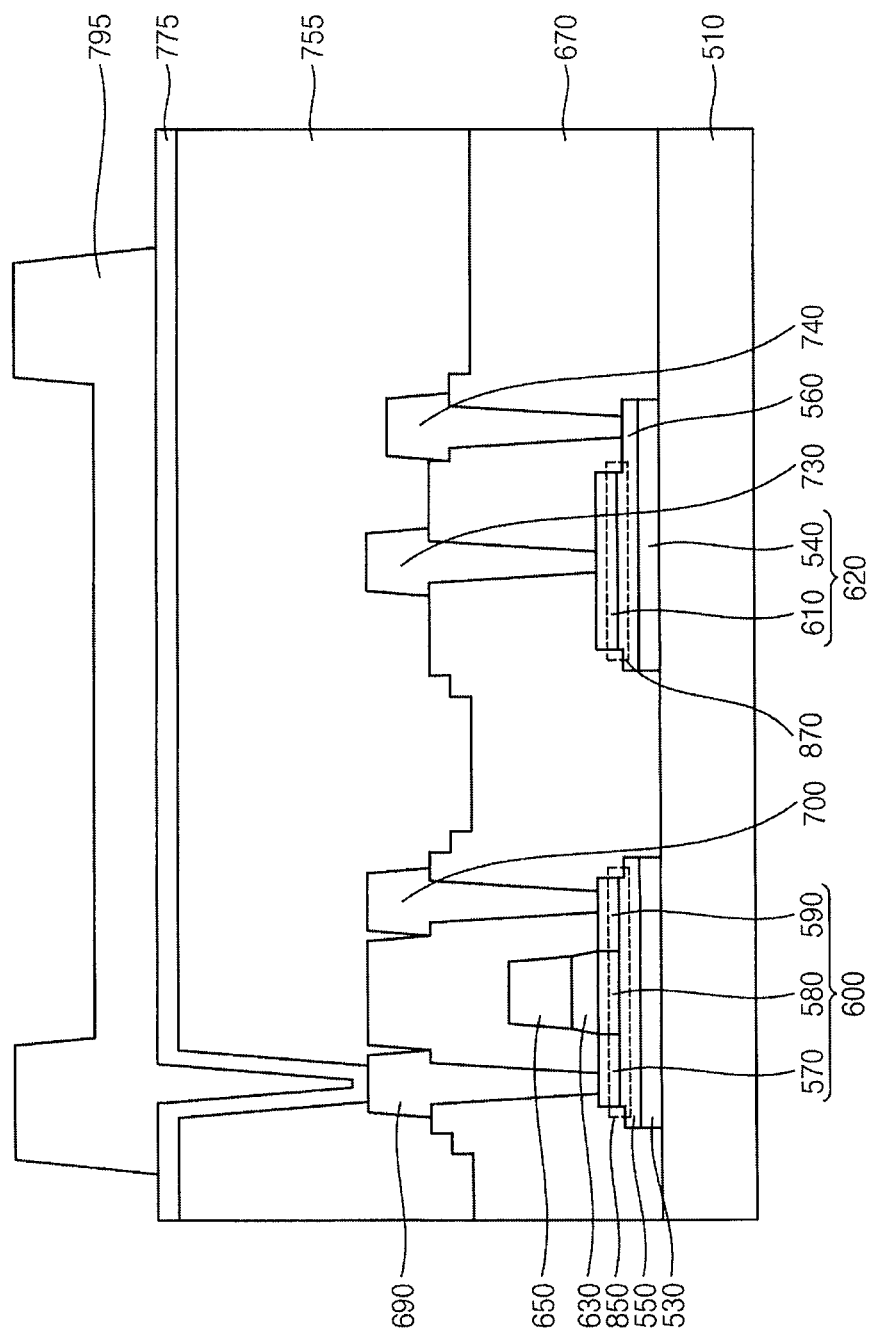

Referring to FIG. 12, a lower electrode layer 775 may be formed on the entire preliminary planarization layer 755. The lower electrode layer 775 may cover the preliminary planarization layer 755, and may extend in the second direction. The lower electrode layer 775 may be in contact with the source electrode 690 via the fifth opening. Here, the lower electrode layer 775 may be formed along an inner surface of the fifth opening. Thus, the lower electrode layer 775 may be electrically connected to the semiconductor element. The lower electrode layer 775 may be formed using a metal, an alloy, a metal nitride, a conductive metal oxide, transparent conductive materials, and/or the like.

A preliminary pixel defining layer 795 may be formed on the preliminary planarization layer 755. The preliminary pixel defining layer 795 having a first thickness and a second thickness may be formed on the lower electrode layer 775 by using a half tone mask. For example, opposite side portions of the preliminary pixel defining layer 795 may have the first thickness, and a center portion of the preliminary pixel defining layer 795 may have the second thickness. Here, the center portion may be interposed between the opposite side portions, and the second thickness may be less than the first thickness. In addition, the preliminary pixel defining layer 795 may fill the fifth opening. The preliminary pixel defining layer 795 may be formed of organic materials or inorganic materials. For example, the preliminary pixel defining layer 795 may be formed using silicon oxide, silicon nitride, silicon oxynitride, silicon oxycarbide, polyimide-based resin, photoresist, acryl-based resin, polyamide-based resin, siloxane-based resin, and/or the like. In example embodiments, in this step, a sixth mask process may be performed.

Figure 13:
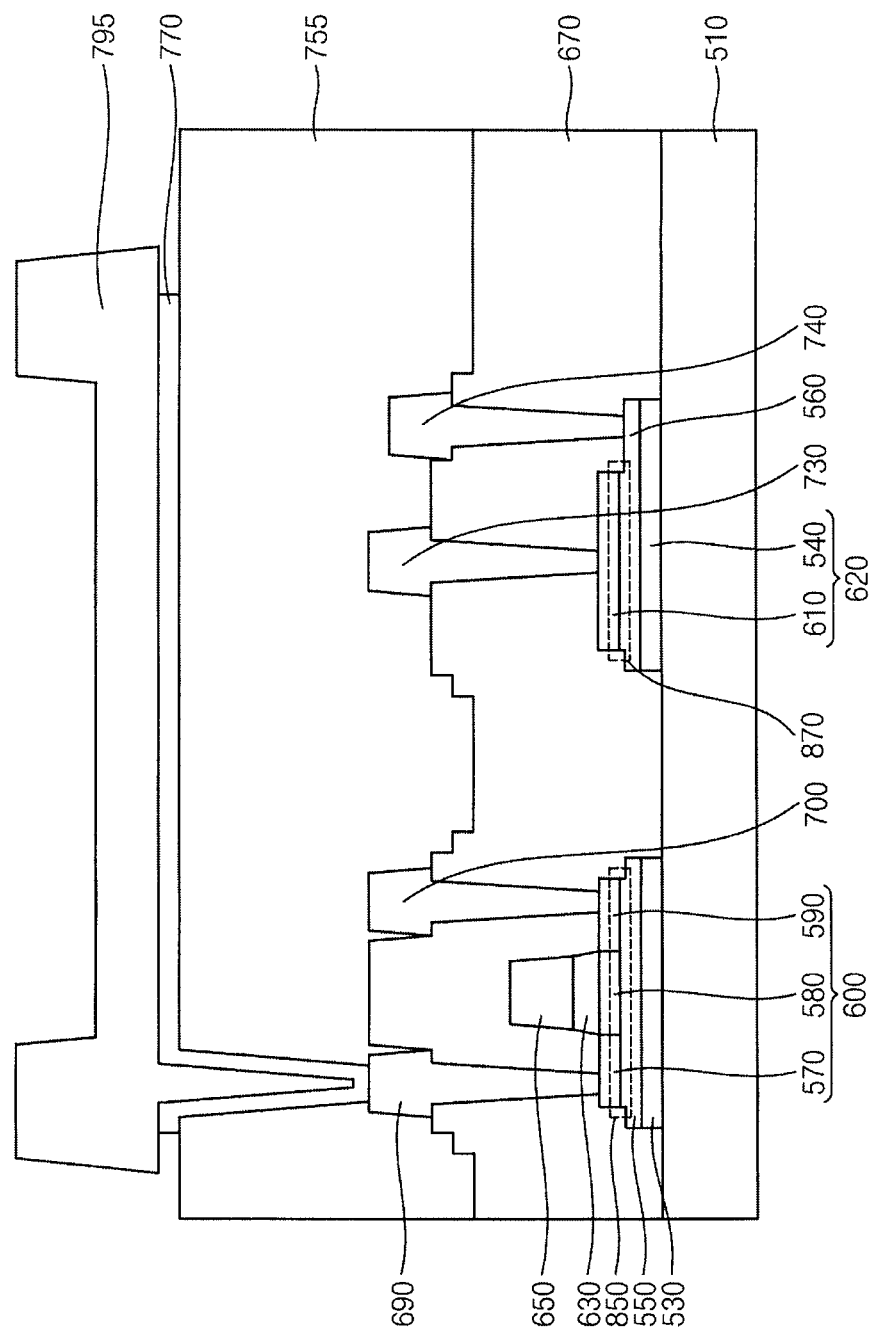

Referring to FIG. 13, the lower electrode layer 775 may be partially removed by using a method by which the preliminary pixel defining layer 795 is used as a mask. In this case, a lower electrode 770 may be formed. In addition, after the lower electrode 770 is formed, the width of the lower electrode 770 may be less than that of the preliminary pixel defining layer 795.

Figure 14:
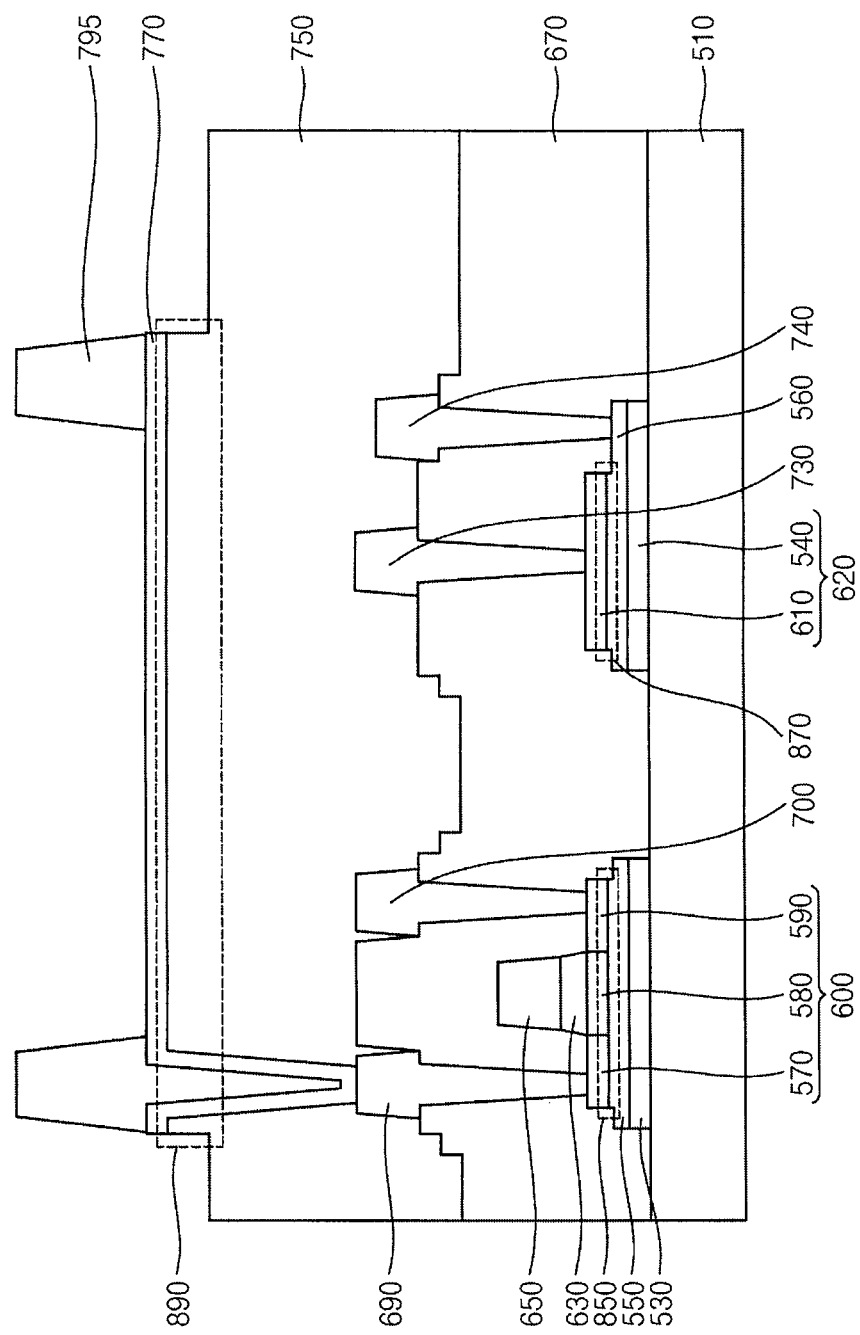

Referring to FIG. 14, the lower electrode 770 may be exposed by removing the center portion that is formed in the second thickness of the preliminary pixel defining layer 795. While the center portion is removed, a portion of the opposite side portions that is formed in the first thickness of the preliminary pixel defining layer 795 may be removed. In addition, while the center portion is removed, opposite side portions of the preliminary planarization layer 755 may be removed. In this case, a planarization layer 750 may be formed. Because the opposite side portions of the preliminary planarization layer 755 are removed, a first protruding portion 890 may be formed. Here, the first protruding portion 890 may be protruded in the first direction.

Figure 15:
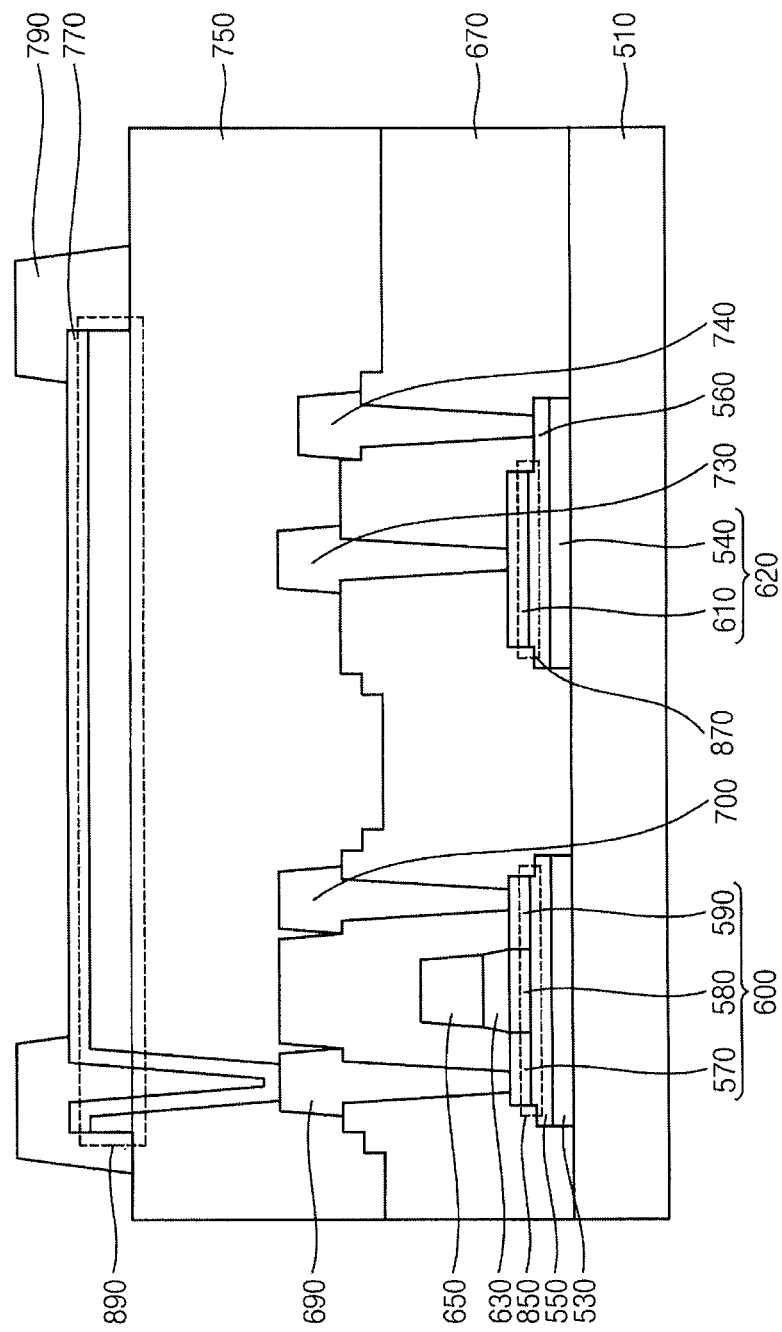

Referring to FIG. 15, the preliminary pixel defining layer 795 may cover the opposite side portions of the lower electrode 770 and the first protruding portion 890 by heating the preliminary pixel defining layer 795. In this case, a pixel defining layer 790 may be formed.

Figure 16:
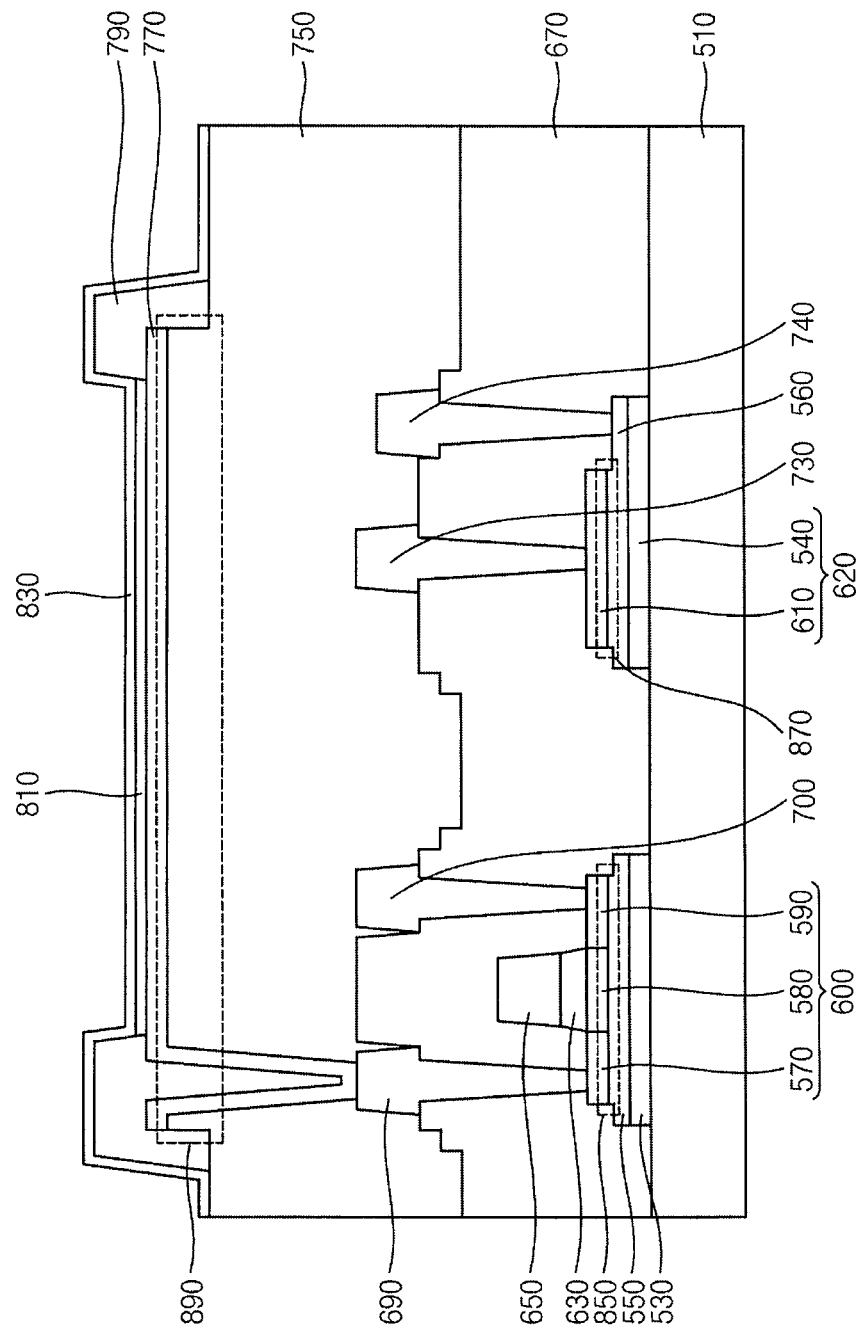

Referring to FIG. 16, a light emitting layer 810 may be formed on at least a portion the lower electrode 770 that is exposed by the pixel defining layer 790. The light emitting layer 810 may be formed using at least one selected from light emitting materials capable of generating different colors of light (e.g., a red color of light, a green color of light, a blue color of light). Alternatively, the light emitting layer 810 may emit a white color of light by stacking light emitting materials capable of generating different colors of light such as the red color of light, the green color of light, the blue color of light, and/or the like.

An upper electrode 830 may be formed on the pixel defining layer 790 and the light emitting layer 810. The upper electrode 830 may cover the pixel defining layer 790 and the light emitting layer 810, and may extend in the second direction. That is, the upper electrode 830 may be formed on the entire substrate 510. The upper electrode 830 may be formed using a metal, an alloy, metal nitride, conductive metal oxide, transparent conductive materials, and/or the like.

Figure 17:
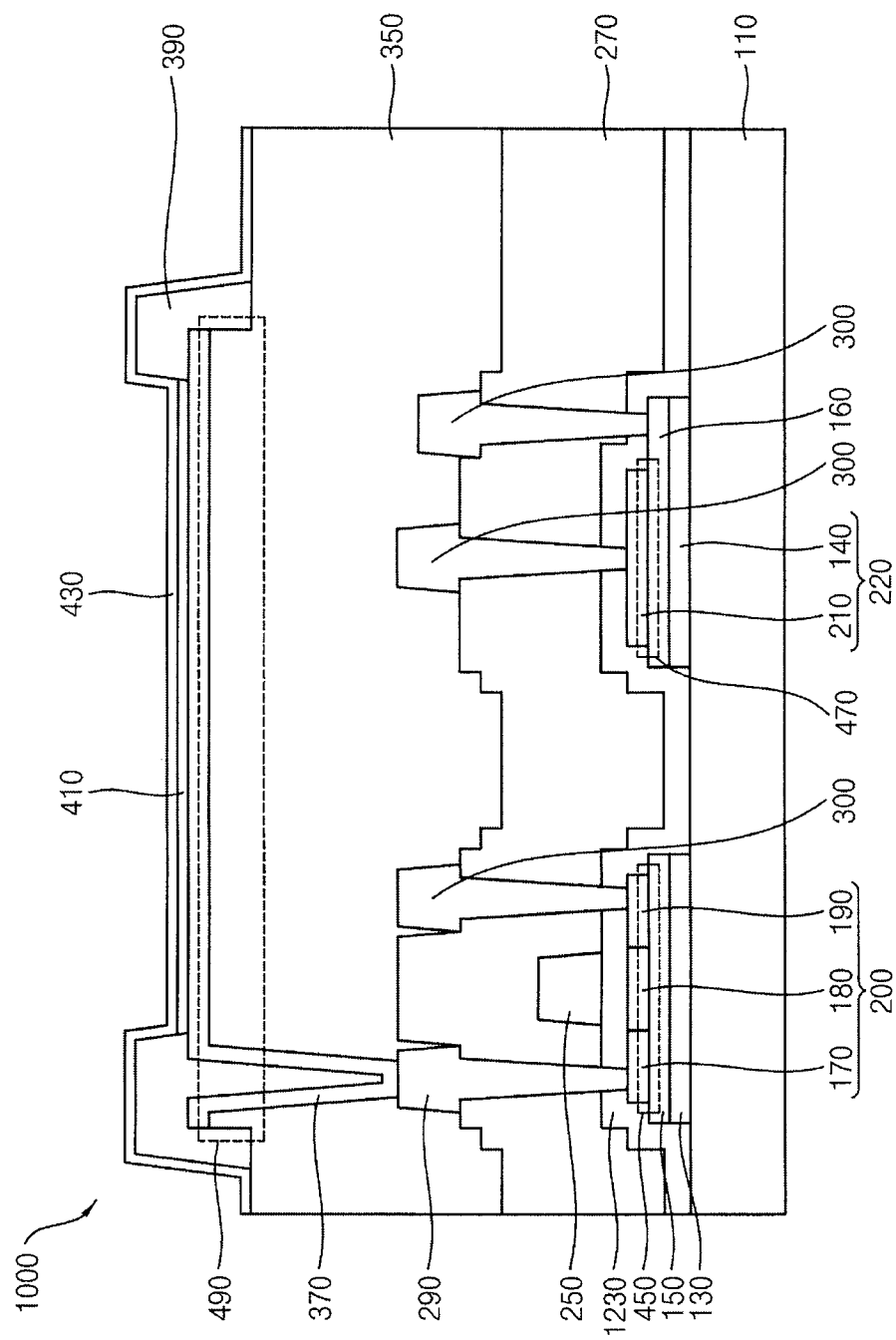
FIG. 17 is a cross-sectional view illustrating an organic light emitting display device in accordance with some example embodiments of the present invention.

FIG. 17 is a cross-sectional view illustrating an organic light emitting display device in accordance with some example embodiments of the present invention. An organic light emitting display device 1000 illustrated in FIG. 17 may have a configuration substantially the same as or similar to that of an organic light emitting display device 100 described with reference to FIG. 1, except a shape of the gate insulation layer 1230. In FIG. 17, detailed descriptions for elements, which are substantially the same as or similar to the elements described with reference to FIG. 1, may not be provided.

Referring to FIG. 17, an organic light emitting display (OLED) device 1000 may include a substrate 110, a first conductive layer pattern 130, a second conductive layer pattern 140, a first insulation layer pattern 150, a second insulation layer pattern 160, a first semiconductor layer pattern 200, a second semiconductor layer pattern 210, a gate insulation layer 1230, a gate electrode 250, an insulating interlayer 270, a source electrode 290, a drain electrode 300, a first electrode 330, a second electrode 340, a planarization layer 350, a lower electrode 370, a pixel defining layer 390, a light emitting layer 410, an upper electrode 430, first through third protruding portion 490, 450, and 470. Here, the first semiconductor layer pattern 200 may have a source region 170, a channel region 180, and a drain region 190. In example embodiments, the planarization layer 350 may have the first protruding portion 490, and the first insulation layer pattern 150 may have the second protruding portion 450. In addition, the second insulation layer pattern 160 may have the third protruding portion 470. As the first conductive layer pattern 130 is disposed in a portion under which the channel region 180 is located, the OLED device 1000 may serve as an OLED device capable of protecting the channel region 180.

The first semiconductor layer pattern 200 may be disposed in a first region on the first insulation layer pattern 150. The first semiconductor layer pattern 200 may have a source region 170, a drain region 190, and a channel region 180 that is located between the source region 170 and the drain region 190. Here, after the gate insulation layer 1230 is disposed on the entire substrate 110, an ion implantation process may be performed. The channel region 180 may not be doped by the gate electrode 250, and the source region 170 and the drain region 190 may be doped with an impurity. As a result, the source region 170 and the drain region 190 may serve as a conductor.

The second semiconductor layer pattern 210 may be disposed in a second region on the second insulation layer pattern 160. The second semiconductor layer pattern 210 may have a first contact region that is in contact with the first electrode 330. After the gate insulation layer 1230 is disposed on the entire substrate 110, the ion implantation process may be performed. The second semiconductor layer pattern 210 may be doped with an impurity. As a result, the second semiconductor layer pattern 210 may serve as a conductor. Each of the first semiconductor layer pattern 200 and the second semiconductor layer pattern 210 may be formed of poly silicon.

The gate insulation layer 1230 may be disposed on the substrate 110, the first conductive layer pattern 130, the first insulation layer pattern 150, the first semiconductor layer pattern 200, the second conductive layer pattern 140, the second insulation layer pattern 160, and the second semiconductor layer pattern 210. The gate insulation layer 1230 may cover the first conductive layer pattern 130, the first insulation layer pattern 150, the first semiconductor layer pattern 200, the second conductive layer pattern 140, the second insulation layer pattern 160, and the second semiconductor layer pattern 210 on the substrate 110, may extend a second direction. That is, the gate insulation layer 1230 may be disposed on the entire substrate 110 along a profile of the first conductive layer pattern 130, the first insulation layer pattern 150, the first semiconductor layer pattern 200, the second conductive layer pattern 140, the second insulation layer pattern 160, and the second semiconductor layer pattern 210. The gate insulation layer 1230 may be formed of silicon oxide, metal oxide, and/or the like.

The present invention may be applied to various suitable display devices including an organic light emitting display device. For example, the present invention may be applied to the mobile phone, the smart phone, the smart pad, the laptop computer, the tablet computer, the personal digital assistant (PDA), the portable multimedia player (PMP), the digital camera, the music player (e.g., a MP3 player), the portable game console, the navigation, a vehicle-display device, a ship-display device, an aircraft-display device, portable communication devices, display devices for display or for information transfer, a medical-display device and/or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and aspects of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and equivalents thereof.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "under" other elements or features would then be oriented "above" the other elements or features. Thus, the example terms "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept."

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

What is claimed is:

1. An organic light emitting display device, comprising:
   a substrate;
   a first conductive layer pattern on the substrate;
   a first insulation layer pattern on the first conductive layer pattern;
   a first semiconductor layer pattern on the first insulation layer pattern;
   a gate insulation layer pattern on the first semiconductor layer pattern;
   a gate electrode on the gate insulation layer pattern;
   a planarization layer on the gate electrode, the planarization layer comprising a first protruding portion protruded in a first direction perpendicular to an upper surface of the substrate;
   a lower electrode on the first protruding portion;
   a pixel defining layer exposing at least a portion of the lower electrode, the pixel defining layer covering opposite side portions of the first protruding portion;
   a light emitting layer on the lower electrode; and
   an upper electrode on the light emitting layer,
   wherein a width of an upper surface of the first insulation layer pattern is the same as that of the first semiconductor layer pattern.

2. The organic light emitting display device of claim 1, wherein the first insulation layer pattern comprises a second protruding portion,
   wherein the first semiconductor layer pattern comprises a source region, a drain region, and a channel region between the source region and the drain region,
   wherein the first semiconductor layer pattern is on the second protruding portion, and
   wherein the gate insulation layer pattern is between the gate electrode and the channel region, and exposes the source and drain regions.

3. The organic light emitting display device of claim 2, wherein a width of the first conductive layer pattern is the same as that of a lower surface of the first insulation layer pattern.

4. The organic light emitting display device of claim 3, wherein the width of the upper surface of the first insulation layer pattern is less than that of a lower surface of the first insulation layer pattern.

5. The organic light emitting display device of claim 3, wherein the first semiconductor layer pattern exposes opposite side portions of the first insulation layer pattern.

6. The organic light emitting display device of claim 1, wherein the gate insulation pattern covers the substrate and the first semiconductor layer pattern.

7. The organic light emitting display device of claim 1, further comprising:
   a second conductive layer pattern on the substrate, the second conductive layer being spaced from the first conductive pattern, the second conductive layer having a contact region;
   a second insulation layer pattern on the second conductive layer pattern, the second insulation layer pattern having a third protruding portion protruded in the first direction; and
   a second semiconductor layer pattern on the third protruding portion, the semiconductor layer pattern having a second contact region,
   wherein the first semiconductor layer pattern comprises a source region, a drain region, and a channel region between the source region and the drain region.

8. An organic light emitting display device, comprising:
   a substrate;
   a first conductive layer pattern on the substrate;
   a first insulation layer pattern on the first conductive layer pattern;
   a first semiconductor layer pattern on the first insulation layer pattern;
   a gate insulation layer pattern on the gate insulation layer pattern;
   a gate electrode on the gate insulation layer pattern;
   a planarization layer on the gate electrode, the planarization layer comprising a first protruding portion protruded in a first direction perpendicular to an upper surface of the substrate;
   a lower electrode on the first protruding portion;
   a pixel defining layer exposing at least a portion of the lower electrode, the pixel defining layer covering opposite side portions of the first protruding portion;
   a light emitting layer on the lower electrode;
   an upper electrode on the light emitting layer;

a second conductive layer pattern on the substrate, the second conductive layer being spaced from the first conductive pattern, the second conductive layer having a contact region;

a second insulation layer pattern on the second conductive layer pattern, the second insulation layer pattern having a third protruding portion protruded in the first direction; and a second semiconductor layer pattern on the third protruding portion, the semiconductor layer pattern having a second contact region, wherein the first semiconductor layer pattern comprises a source region, a drain region, and a channel region between the source region and the drain region, and wherein the organic light emitting display device further comprises:

an insulating interlayer between the substrate and the planarization layer, the insulating interlayer having first through fourth openings;

a source electrode contacting the source region via the first opening;

a drain electrode contacting the drain region via the second opening, the drain electrode defining a semiconductor element together with a gate electrode pattern, the first semiconductor layer pattern, and the source electrode;

a first electrode contacting a first contact region via the third opening; and a second electrode contacting the second contact region via the fourth opening, the second electrode defining a capacitor together with the second conductive layer pattern, the second semiconductor layer pattern, and the first electrode.

9. The organic light emitting display device of claim 8, wherein the fourth opening penetrates the insulating interlayer and the second insulation layer.

10. The organic light emitting display device of claim 7, wherein a width of an upper surface of the second conductive layer pattern is the same as that of a lower surface of the second insulation layer, and a width of the second semiconductor layer pattern is the same as that of an upper surface of the second insulation layer, and wherein a width of an upper surface of the second insulation layer pattern is less than that of a lower surface of the second insulation layer pattern.

11. The organic light emitting display device of claim 10, wherein the second semiconductor layer pattern exposes opposite side portions of the second insulation layer pattern.

12. A method of manufacturing an organic light emitting display device, the method comprising:

forming a semiconductor element on a substrate;

forming a preliminary planarization layer that covers the semiconductor on the substrate;

forming a lower electrode layer on the preliminary planarization layer;

forming a preliminary pixel defining layer on the lower electrode layer by using a half tone mask;

forming a pixel defining layer, a lower electrode, and a planarization layer having a third protruding portion by partially removing the preliminary pixel defining layer, the lower electrode layer, and the preliminary planarization layer;

covering opposite side portions of a first protruding portion with the pixel defining layer by heating the pixel defining layer;

forming a light emitting layer on the lower electrode; and forming an upper electrode on the light emitting layer.

13. The method of claim 12, wherein prior to forming the planarization layer, the method further comprises:

forming an insulating interlayer having first through fourth openings between the substrate and the planarization layer; and forming a source electrode, a drain electrode, a first electrode, and a second electrode in the first through fourth openings, respectively.

14. The method of claim 12, wherein forming the preliminary pixel defining layer on the lower electrode layer by using the half tone mask comprises:

forming a preliminary pixel defining layer having a first thickness on opposite side portions of the lower electrode layer and a second thickness on a center portion of the lower electrode layer, and wherein the second thickness is less than the first thickness, and the center portion is between the opposite side portions.

15. The method of claim 14, wherein forming the pixel defining layer, the lower electrode, and the planarization layer having the third protruding portion by partially removing the preliminary pixel defining layer, the lower electrode layer, and the preliminary planarization layer comprises:

exposing the lower electrode by removing a portion of the preliminary pixel defining layer having the second thickness on a center portion of the lower electrode layer, and wherein a portion of the preliminary planarization layer is removed while the preliminary pixel defining layer is removed, and a first protruding portion of the planarization layer is formed.

16. The method of claim 12, wherein the substrate comprises a first region and a second region that is spaced apart from the first region, wherein forming the semiconductor element on the substrate comprises:

forming a conductive layer on the substrate;

forming an insulation layer on the conductive layer;

forming a semiconductor layer on the insulation layer;

forming a first conductive layer pattern, a first insulation layer pattern having a second protruding portion, and a first semiconductor layer pattern in the first region and forming a second conductive layer pattern, a second insulation layer pattern having the third protruding portion, and a second semiconductor layer pattern in the second region by partially removing the conductive layer, the insulation layer, and the semiconductor layer;

forming a gate insulation layer covering the conductive layer patterns, the insulation layer patterns, and the semiconductor patterns;

forming a gate electrode layer on the gate insulation layer; and forming a gate electrode and a gate insulation layer pattern by partially removing the gate electrode layer and the gate insulation layer.

17. The method of claim 16, wherein after forming the semiconductor layer on the insulation layer, the method further comprises:

forming a first photoresist having a first thickness in the first region and forming a second photoresist having the first thickness and a second thickness in the second region by using a half tone mask, wherein the second thickness is less than the first thickness.

18. The method of claim 17, further comprising:

exposing a first portion of the second semiconductor layer pattern by removing the second photoresist formed in the second thickness; and removing a portion of the second semiconductor layer pattern, wherein opposite side portions of the first semiconductor layer pattern are exposed while the second photoresist formed in the second thickness is removed, and a second portion opposite to the first portion of the second semiconductor layer pattern is exposed, and wherein opposite side portions of the exposed first semiconductor layer pattern and the second portion of the exposed second semiconductor layer pattern are removed while the first portion of the second semiconductor layer pattern is removed.

19. The method of claim 16, wherein after forming the gate electrode layer on the gate insulation layer, the method further comprises:

forming a photoresist on a portion of the gate electrode in the first region.

20. The method of claim 19, wherein forming the gate electrode layer on the gate insulation layer comprises:

partially removing the gate electrode layer; and partially removing the gate insulation layer, wherein opposite side portions of each of the first and second insulation layer patterns are removed while the gate insulation layer is removed, and each of the second and third protruding portions is formed.

21. The organic light emitting display device of claim 1, wherein the first protruding portion overlaps the entire light emitting layer, and an upper surface of the first protruding portion has a substantially level surface.

* * * * *